(12) United States Patent
Brandl et al.

(10) Patent No.: US 11,176,986 B2
(45) Date of Patent: Nov. 16, 2021

(54) MEMORY CONTEXT RESTORE, REDUCTION OF BOOT TIME OF A SYSTEM ON A CHIP BY REDUCING DOUBLE DATA RATE MEMORY TRAINING

(71) Applicant: Advanced Micro Devices, Inc., Santa Clara, CA (US)

(72) Inventors: Kevin M. Brandl, Austin, TX (US); Naveen Davanam, Austin, TX (US); Oswin E. Housty, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/730,086

(22) Filed: Dec. 30, 2019

(65) Prior Publication Data

US 2021/0201986 A1     Jul. 1, 2021

(51) Int. Cl.
| | |
|---|---|
| *G11C 7/00* | (2006.01) |
| *G11C 11/406* | (2006.01) |
| *G06F 12/02* | (2006.01) |
| *G06F 13/40* | (2006.01) |
| *G06F 13/16* | (2006.01) |
| *G06F 1/3234* | (2019.01) |

(52) U.S. Cl.
CPC ...... *G11C 11/40622* (2013.01); *G06F 1/3275* (2013.01); *G06F 12/0238* (2013.01); *G06F 13/1689* (2013.01); *G06F 13/4072* (2013.01); *G06F 13/4086* (2013.01)

(58) Field of Classification Search
CPC ............. G11C 11/40622; G06F 1/3275; G06F 12/0238; G06F 13/1689; G06F 13/4072; G06F 13/4086

USPC .......................................................... 365/22
See application file for complete search history.

(56) References Cited

U.S. PATENT DOCUMENTS

| | | | |
|---|---|---|---|
| 2009/0187689 A1 | 7/2009 | Roohparvar | |
| 2012/0216059 A1 | 8/2012 | Barth et al. | |
| 2013/0124806 A1 | 5/2013 | Searles et al. | |
| 2014/0032947 A1 | 1/2014 | Ahmad et al. | |
| 2017/0068308 A1* | 3/2017 | Park | G06F 1/3228 |

(Continued)

FOREIGN PATENT DOCUMENTS

KR    10-2017-0111354 A    10/2007

*Primary Examiner* — Huan Hoang
(74) *Attorney, Agent, or Firm* — Volpe Koenig

(57) ABSTRACT

Methods for reducing boot time of a system-on-a-chip (SOC) by reducing double data rate (DDR) memory training and memory context restore. Dynamic random access memory (DRAM) controller and DDR physical interface (PHY) settings are stored into a non-volatile memory and the DRAM controller and DDR PHY are powered down. On system resume, a basic input/output system restores the DRAM controller and DDR PHY settings from non-volatile memory, and finalizes the DRAM controller and DDR PHY settings for operation with the SOC. Reducing the boot time of the SOC by reducing DDR training includes setting DRAMs into self-refresh mode, and programing a self-refresh state machine memory operation (MOP) array to exit self-refresh mode and update any DRAM device state for the target power management state. The DRAM device is reset, and the self-refresh state machine MOP array reinitializes the DRAM device state for the target power management state.

20 Claims, 9 Drawing Sheets

(56) References Cited

U.S. PATENT DOCUMENTS

2017/0345483 A1* 11/2017 Wang .................... G11C 7/1072
2019/0056879 A1* 2/2019 Hudson ................. G06F 3/0632

* cited by examiner

MEMORY CONTEXT RESTORE, REDUCTION OF BOOT TIME OF A SYSTEM ON A CHIP BY REDUCING DOUBLE DATA RATE MEMORY TRAINING

BACKGROUND

Dynamic random-access memory (DRAM) is a commonly used type of memory in a computer system. DRAM is a volatile memory that requires proper initialization and periodic calibration in order to maintain performance.

BRIEF DESCRIPTION OF THE DRAWINGS

A more detailed understanding can be had from the following description, given by way of example in conjunction with the accompanying drawings wherein.

DETAILED DESCRIPTION

The present teaching provides a method to reduce the boot time of a system by eliminating or reducing double data rate (DDR) training steps on subsequent reboots. Hardware-based mechanisms are used to quickly re-initialize the dynamic random-access memory (DRAM) devices using settings from a previous boot. This technique allows flexibility to use dual in-line memory modules (DIMMs), which may be changed in factory or by an end customer in the field, and still maintain subsequent fast boots for an improved user experience. For example, for advanced DDR training steps it may take 1 to 2 seconds to optimize timings, voltages, decision feedback equalizer (DFE)/feed-forward equalizer (FFE) for a DDR channel on the first boot. However, once those values are known for a given processor/platform (motherboard/module/DRAM) combination, the subsequent training may be eliminated (DDR4, or reduced in the case of LPDDR4 systems, for example). This allows the system to skip or reduce the DDR training steps, including the loading of training firmware code and running multiple lengthy training firmware steps.

The present teaching leverages an initialization flow which can save and restore DRAM controllers and DDR physical interface (PHY) configuration settings from non-volatile memory. In the system resume, the DRAM contents and settings may be preserved, or the basic input/output system (BIOS) may choose to optionally reset and reinitialize the DRAM and the DRAM contents.

Methods for reducing boot time of an SOC by reducing DDR training and memory context restore by reducing DDR training are disclosed. The methods include storing DRAM controller and DDR PHY settings into a non-volatile memory, powering down a DRAM controller and a DDR PHY. On system resume, a BIOS restoring DRAM controller and DDR PHY settings from the non-volatile memory, and finalizing DRAM controller and DDR PHY settings for mission-mode operation with the SOC. The method for the reduced boot time of an SOC by reducing DDR training further includes setting DRAMs into self-refresh mode, and programing the self-refresh state machine memory operation (MOP) array to exit self-refresh and update any DRAM device state for the target power management state. The method for the memory context restore by reducing DDR training further includes resetting the DRAM device, and programing the self-refresh state machine MOP array to reinitialize the DRAM device state for the target power management state.

While the disclosure includes a discussion of a DRAM memory and DRAM controller as particular embodiments, one of ordinary skill in the art will recognize that other types of memory may be utilized in the current embodiments. DRAM therefore includes any form of memory, and these memory types may be substituted for DRAM herein. The DRAM controller is understood to be a memory controller controlling the respective memory in use, even though the examples herein are directed to a DRAM controller.

Figure 1:
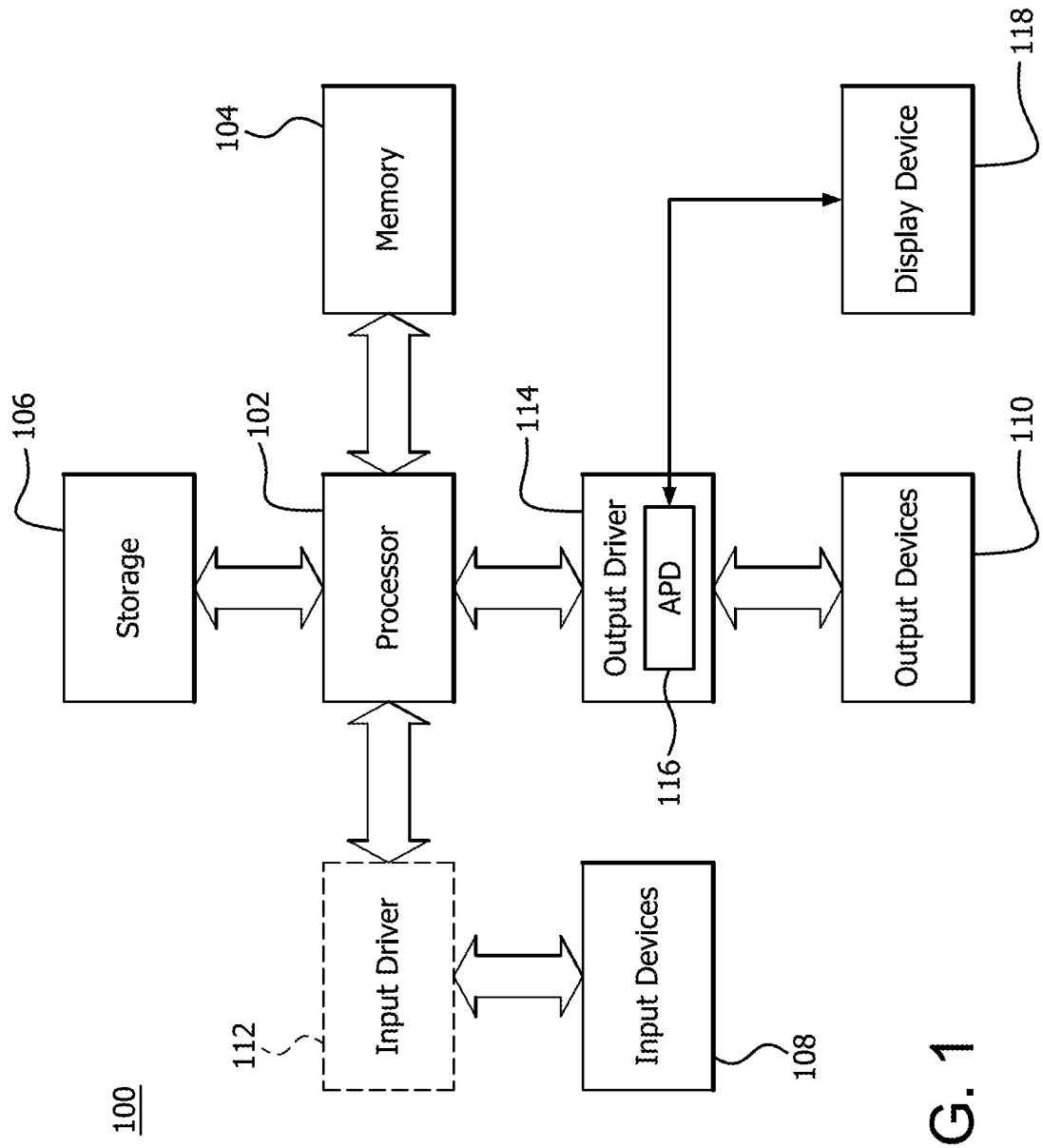
FIG. 1 is a block diagram of an example device in which one or more features of the disclosure can be implemented.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. The output driver 114 includes an accelerated processing device (APD) 116 which is coupled to a display device 118. The APD accepts compute commands and graphics rendering commands from processor 102, processes those compute and graphics rendering commands, and provides pixel output to display device 118 for display. As described in further detail below, the APD 116 includes one or more parallel processing units to perform computations in accordance with a single-instruction-multiple-data (SIMD) paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and provides graphical output to a display device 118. For example, it is contemplated that any processing system that performs processing tasks in accordance with a SIMD paradigm may perform the functionality described herein. Alternatively, it is contemplated that computing systems that do not perform processing tasks in accordance with a SIMD paradigm performs the functionality described herein.

Figure 2:
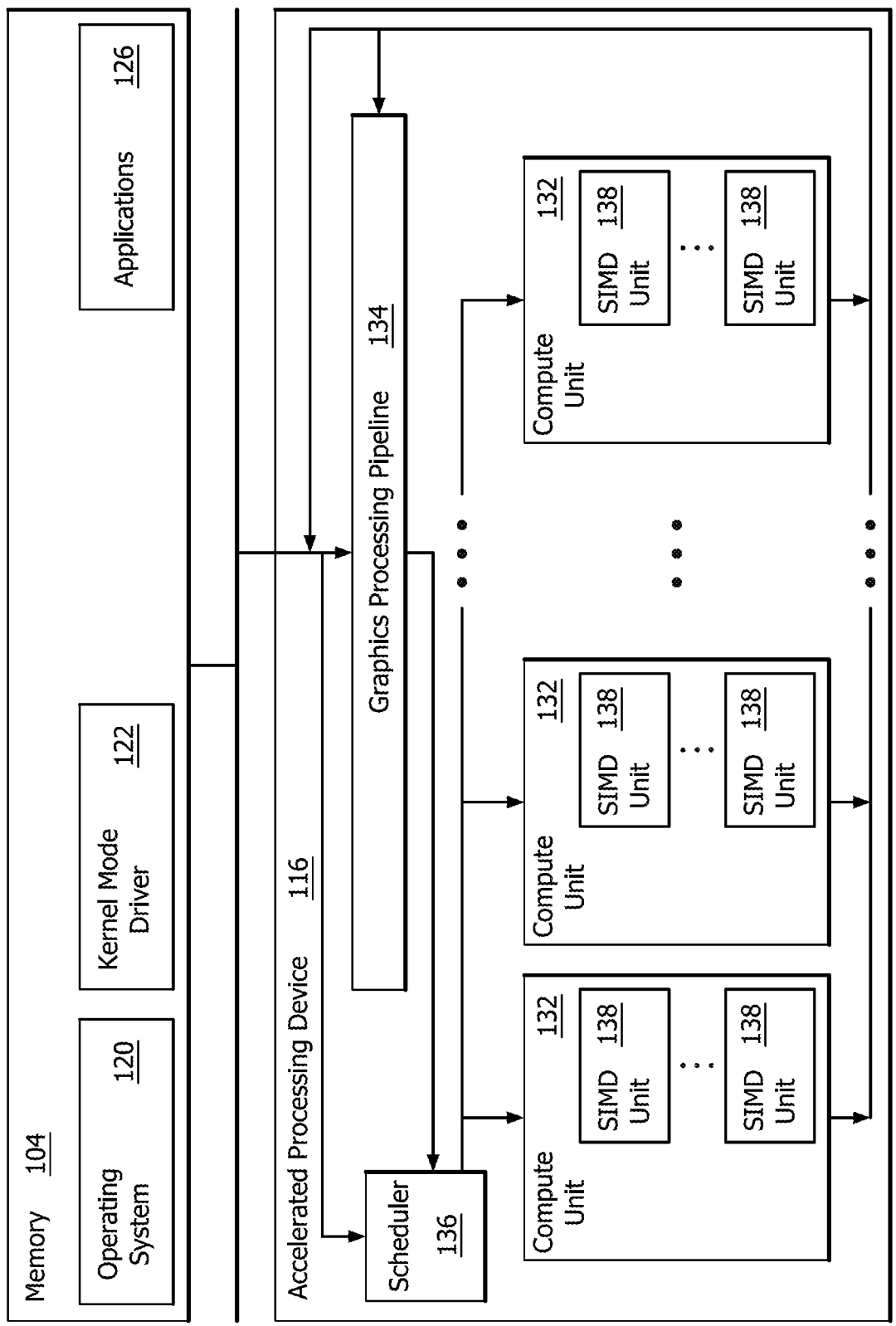
FIG. 2 is a block diagram of the device of FIG. 1, illustrating additional detail.

FIG. 2 is a block diagram of the device 100, illustrating additional details related to execution of processing tasks on the APD 116. The processor 102 maintains, in system memory 104, one or more control logic modules for execution by the processor 102. The control logic modules include an operating system 120, a kernel mode driver 122, and applications 126. These control logic modules control various features of the operation of the processor 102 and the APD 116. For example, the operating system 120 directly communicates with hardware and provides an interface to the hardware for other software executing on the processor 102. The kernel mode driver 122 controls operation of the APD 116 by, for example, providing an application programming interface (API) to software (e.g., applications 126) executing on the processor 102 to access various functionality of the APD 116. The kernel mode driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that perform operations at the request of the processor 102 in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed sequentially on a single SIMD unit 138 or partially or fully in parallel on different SIMD units 138. Wavefronts can be thought of as the largest collection of work-items that can be executed simultaneously on a single SIMD unit 138. Thus, if commands received from the processor 102 indicate that a particular program is to be parallelized to such a degree that the program cannot execute on a single SIMD unit 138 simultaneously, then that program is broken up into wavefronts which are parallelized on two or more SIMD units 138 or serialized on the same SIMD unit 138 (or both parallelized and serialized as needed). A scheduler 136 performs operations related to scheduling various wavefronts on different compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

As will be described below, a memory controller includes a controller and a MOP array. The controller has an input for receiving a power state change request signal and an output for providing memory operations. The MOP array includes a plurality of entries, each entry including a plurality of encoded fields. The controller is responsive to an activation of the power state change request signal to access the MOP array to fetch at least one entry, and to issue at least one memory operation indicated by the entry. The memory controller can, for example, have portions of the MOP array that describe specific memory operations used to implement a power state change request. For example, DDR4 and LPDDR4 DRAMs implement different state machines and different low power modes, and require different sequences to move from an active state to a low power state. In one case, the memory controller can use the MOP array to define commands to be written to a register control word (RCW) or a buffer control word (BCW) of a DDR registered DIMM and load reduced DIMM.

In another form, such a memory controller can be included in a processor of a processing system including the processor and a memory module. The processor may further include a physical interface (PHY) coupled between the memory controller and the memory system.

In yet another form, a method for controlling a power state of a memory system is disclosed. A power state change signal is received. A MOP array is accessed in response to the power state change request signal. An entry of the MOP array is decoded into at least one memory operation. Each memory operation, so decoded, is outputted. The decoding and outputting are repeated for successive entries in the MOP array until a predetermined termination condition occurs. The predetermined termination condition may be, for example, a null entry in the MOP array. The received power state change request signal may be a change from an active state to a low power state such as precharge power down, self-refresh power down, or idle power down, or could be a change from one operation frequency to another operation frequency in an active state. A BIOS can also program the MOP array in response to detecting characteristics of the memory system.

Figure 3:
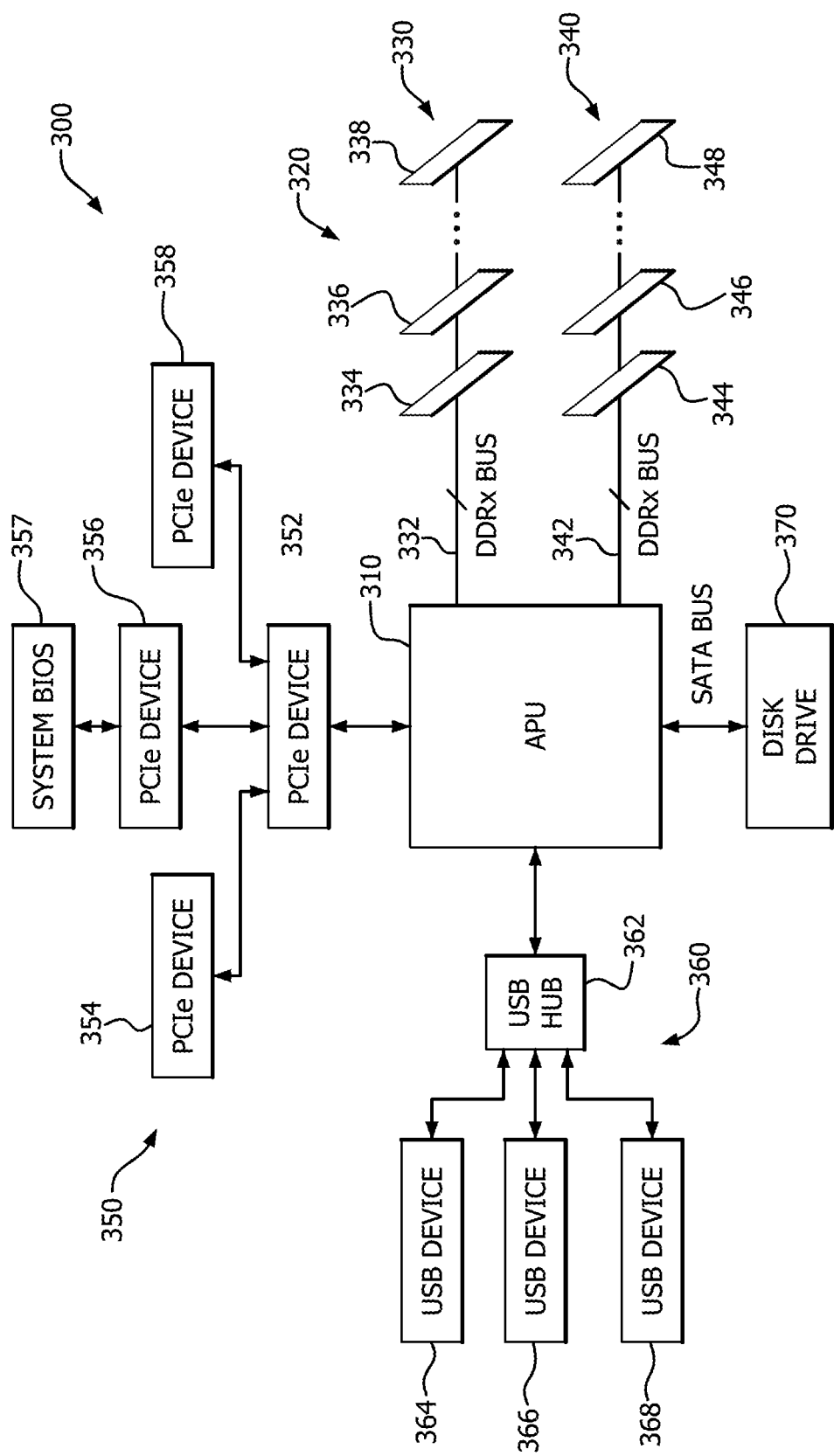
FIG. 3 illustrates in block diagram form a data processing system according to some embodiments.

FIG. 3 illustrates in block diagram form a data processing system 300 according to some embodiments. Data processing system 300 includes generally a data processor 310 in the form of an accelerated processing unit (APU), a memory system 320, a peripheral component interconnect express (PCIe) system 350, a universal serial bus (USB) system 360, and a disk drive 370. Data processor 310 operates as the central processing unit (CPU) of data processing system 300 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 320 includes a memory channel 330 and a memory channel 340. Memory channel 330 includes a set of dual inline memory modules (DIMMs) connected to a DDRx bus 332, including representative DIMMs 334, 336, and 338 that in this example correspond to separate ranks. Likewise memory channel 340 includes a set of DIMMs connected to a DDRx bus 342, including representative DIMMs 344, 346, and 348.

PCIe system 350 includes a PCIe switch 352 connected to the PCIe root complex in data processor 310, a PCIe device 354, a PCIe device 356, and a PCIe device 358. PCIe device 356 in turn is connected to a system basic input/output system (BIOS) memory 357. System BIOS memory 357 can be any of a variety of non-volatile memory types, such as read-only memory (ROM), flash electrically erasable programmable ROM (EEPROM), and the like.

USB system 360 includes a USB hub 362 connected to a USB master in data processor 310, and representative USB devices 364, 366, and 368 each connected to USB hub 362. USB devices 364, 366, and 368 could be devices such as a keyboard, a mouse, a flash EEPROM port, and the like.

Disk drive 370 is connected to data processor 310 over a SATA bus and provides mass storage for the operating system, application programs, application files, and the like.

Data processing system 300 is suitable for use in modern computing applications by providing a memory channel 330 and a memory channel 340. Each of memory channels 330 and 340 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring. As will be described in more detail below, data processor 310 includes a memory controller that is capable of throttling power in certain circumstances to avoid overheating and to reduce the chance of thermal overload.

Figure 4:
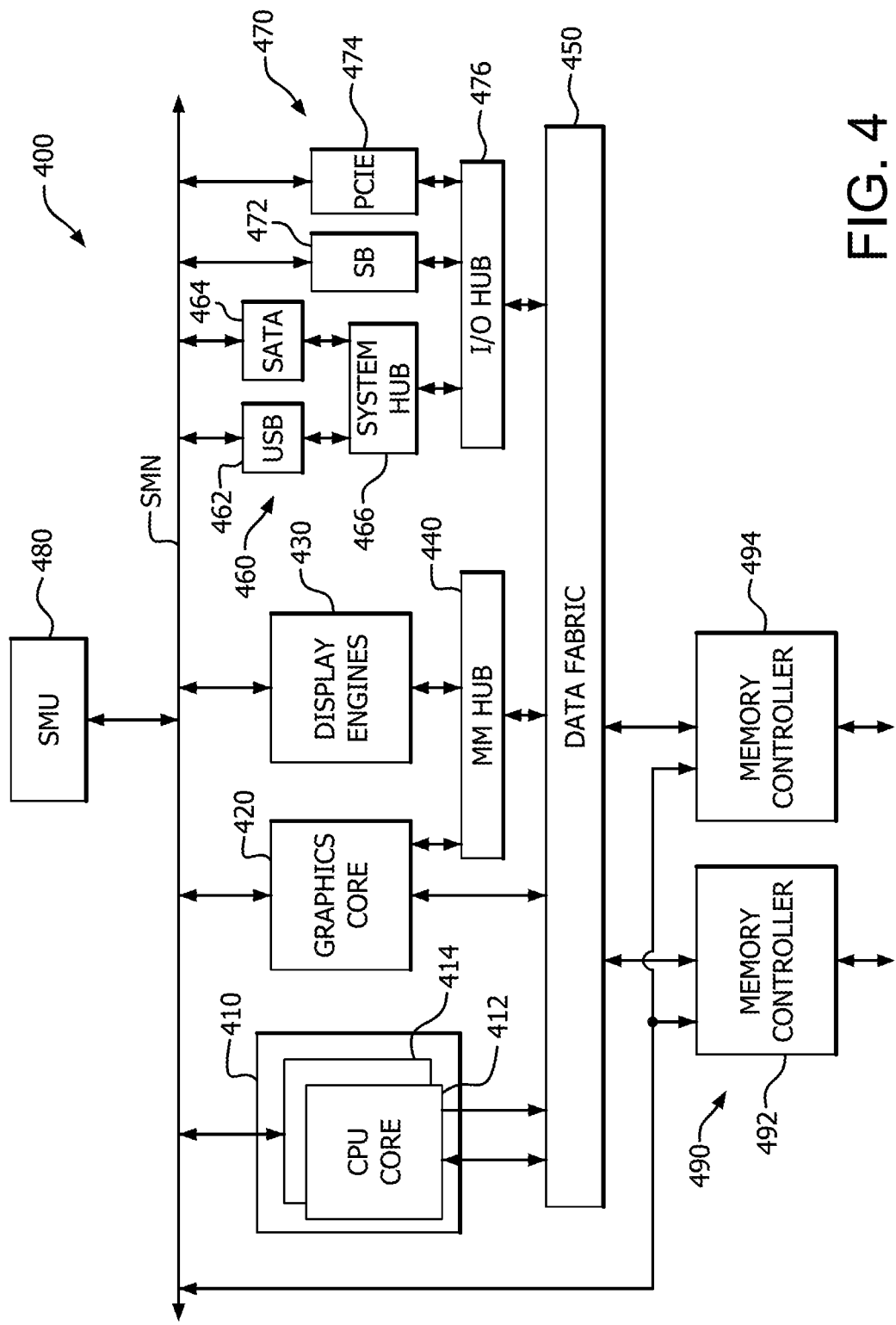
FIG. 4 illustrates in block diagram form an accelerated processing unit (APU) suitable for use in the data processing system of FIG. 3.

FIG. 4 illustrates in block diagram form an APU 400 suitable for use in data processing system 300 of FIG. 3. APU 400 includes generally a central processing unit (CPU) core complex 410, a graphics core 420, a set of display engines 430, a memory management hub 440, a data fabric 450, a set of peripheral controllers 460, a set of peripheral bus controllers 470, a system management unit (SMU) 480, and a set of memory controllers 490.

CPU core complex 410 includes a CPU core 412 and a CPU core 414. In this example, CPU core complex 410 includes two CPU cores, but in other embodiments CPU core complex 410 can include an arbitrary number of CPU cores. Each of CPU cores 412 and 414 is bidirectionally connected to a system management network (SMN), which forms a control fabric, and to data fabric 450, and is capable of providing memory access requests to data fabric 450. Each of CPU cores 412 and 414 may be unitary cores, or may further be a core complex with two or more unitary cores sharing certain resources such as caches.

Graphics core 420 is a high performance graphics processing unit (GPU) capable of performing graphics operations such as vertex processing, fragment processing, shading, texture blending, and the like in a highly integrated and parallel fashion. Graphics core 420 is bidirectionally connected to the SMN and to data fabric 450, and is capable of providing memory access requests to data fabric 450. In this regard, APU 400 may either support a unified memory architecture in which CPU core complex 410 and graphics core 420 share the same memory space, or a memory architecture in which CPU core complex 410 and graphics core 420 share a portion of the memory space, while graphics core 420 also uses a private graphics memory not accessible by CPU core complex 410.

Display engines 430 render and rasterize objects generated by graphics core 420 for display on a monitor. Graphics core 420 and display engines 430 are bidirectionally connected to a common memory management hub 440 for uniform translation into appropriate addresses in memory system 320, and memory management hub 440 is bidirectionally connected to data fabric 450 for generating such memory accesses and receiving read data returned from the memory system.

Data fabric 450 includes a crossbar switch for routing memory access requests and memory responses between any memory accessing agent and memory controllers 490. It also includes a system memory map, defined by BIOS, for determining destinations of memory accesses based on the system configuration, as well as buffers for each virtual connection.

Peripheral controllers 460 include a USB controller 462 and a SATA interface controller 464, each of which is bidirectionally connected to a system hub 466 and to the SMN bus. These two controllers are merely exemplary of peripheral controllers that may be used in APU 400.

Peripheral bus controllers 470 include a system controller or Southbridge (SB) 472 and a PCIe controller 474, each of which is bidirectionally connected to an input/output (I/O) hub 476 and to the SMN bus. I/O hub 476 is also bidirectionally connected to system hub 466 and to data fabric 450. Thus for example a CPU core can program registers in USB controller 462, SATA interface controller 464, SB 472, or PCIe controller 474 through accesses that data fabric 450 routes through I/O hub 476.

SMU 480 is a local controller that controls the operation of the resources on APU 400 and synchronizes communication among them. SMU 480 manages power-up sequencing of the various processors on APU 400 and controls multiple off-chip devices via reset, enable and other signals. SMU 480 includes one or more clock sources not shown in FIG. 4, such as a phase locked loop (PLL), to provide clock signals for each of the components of APU 400. SMU 480 also manages power for the various processors and other functional blocks, and may receive measured power consumption values from CPU cores 412 and 414 and graphics core 420 to determine appropriate power states.

APU 400 also implements various system monitoring and power saving functions. In particular one system monitoring function is thermal monitoring. For example, if APU 400 becomes hot, then SMU 480 can reduce the frequency and voltage of CPU cores 412 and 414 and/or graphics core 420. If APU 400 becomes too hot, then it can be shut down entirely. Thermal events can also be received from external sensors by SMU 480 via the SMN bus, and SMU 480 can reduce the clock frequency and/or power supply voltage in response.

Figure 5:
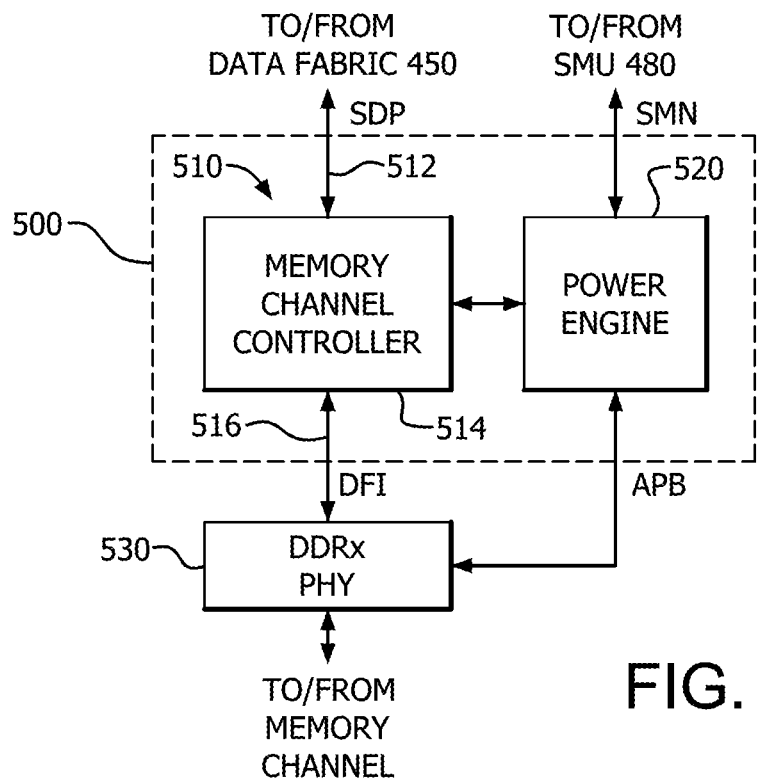
FIG. 5 illustrates in block diagram form a memory controller and associated physical interface (PHY) suitable for use in the APU of FIG. 4 according to some embodiments.

FIG. 5 illustrates in block diagram form a memory controller 500 and an associated physical interface (PHY) 530 suitable for use in APU 400 of FIG. 4 according to some embodiments. Memory controller 500 includes a memory channel 510 and a power engine 520. Memory channel 510 includes a host interface 512, a memory channel controller 514, and a physical interface 516. Host interface 512 bidirectionally connects memory channel controller 514 to data fabric 450 over a scalable data port (SDP). Physical interface 516 bidirectionally connects memory channel controller 514 to PHY 530 over a bus that conforms to the DDR-PHY Interface Specification (DFI). Power engine 520 is bidirectionally connected to SMU 480 over the SMN bus, to PHY 530 over the Advanced Peripheral Bus (APB), and is also bidirectionally connected to memory channel controller 514. PHY 530 has a bidirectional connection to a memory channel such as memory channel 330 or memory channel 340 of FIG. 3. Memory controller 500 is an instantiation of a memory controller for a single memory channel using a single memory channel controller 514, and has a power engine 520 to control operation of memory channel controller 514 in a manner that will be described further below.

Figure 6:
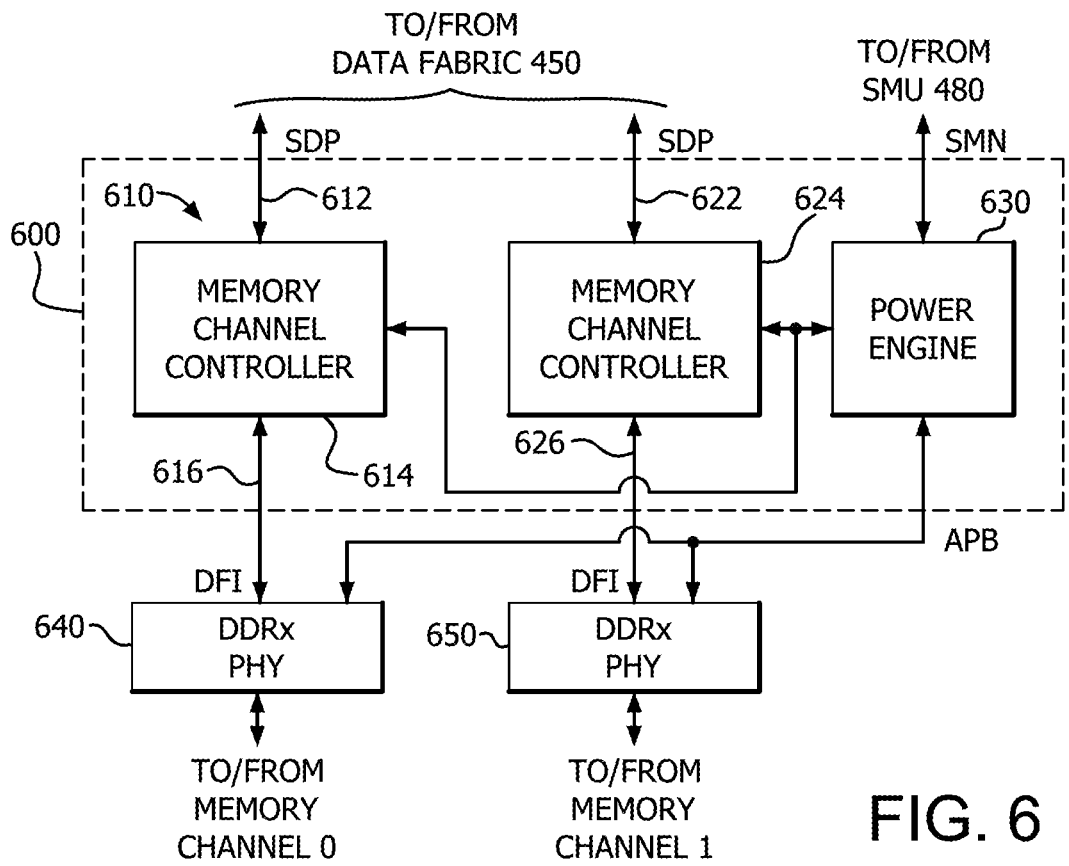
FIG. 6 illustrates in block diagram form another memory controller and associated PHY suitable for use in the APU of FIG. 4 according to some embodiments.

FIG. 6 illustrates in block diagram form another memory controller 600 and associated PHYs 640 and 650 suitable for use in APU 400 of FIG. 4 according to some embodiments. Memory controller 600 includes memory channels 610 and 620 and a power engine 630. Memory channel 610 includes a host interface 612, a memory channel controller 614, and a physical interface 616. Host interface 612 bidirectionally connects memory channel controller 614 to data fabric 450 over an SDP. Physical interface 616 bidirectionally connects memory channel controller 614 to PHY 640, and conforms to the DFI Specification. Memory channel 620 includes a host interface 622, a memory channel controller 624, and a physical interface 626. Host interface 622 bidirectionally connects memory channel controller 624 to data fabric 450 over another SDP. Physical interface 626 bidirectionally connects memory channel controller 624 to PHY 650, and conforms to the DFI Specification. Power engine 630 is bidirectionally connected to SMU 480 over the SMN bus, to PHYs 640 and 650 over the APB, and is also bidirectionally connected to memory channel controllers 614 and 624. PHY 640 has a bidirectional connection to a memory channel such as memory channel 330 of FIG. 3. PHY 650 has a bidirectional connection to a memory channel such as memory channel 340 of FIG. 3. Memory controller 600 is an instantiation of a memory controller having two memory channel controllers and uses a shared power engine 630 to control operation of both memory channel controller 614 and memory channel controller 624 in a manner that will be described further below.

Figure 7:
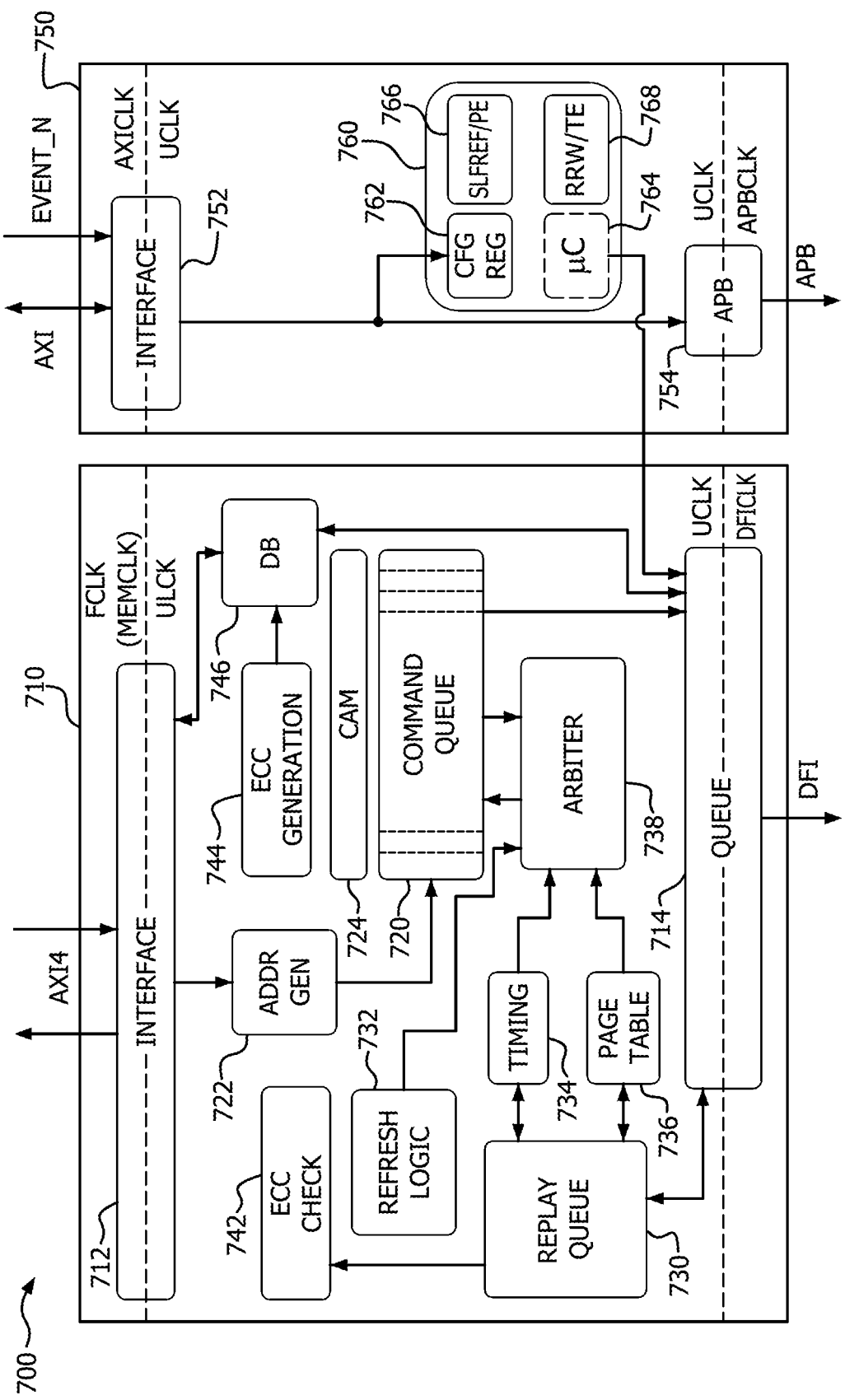
FIG. 7 illustrates in block diagram form a memory controller according to some embodiments.

FIG. 7 illustrates in block diagram form a memory controller 700 according to some embodiments. Memory controller 700 includes generally a memory channel controller 710 and a power controller 750. Memory channel controller 710 includes generally an interface 712, a queue 714, a command queue 720, an address generator 722, a content addressable memory (CAM) 724, a replay queue 730, a refresh logic block 732, a timing block 734, a page table 736, an arbiter 738, an error correction code (ECC) check block 742, an ECC generation block 744, and a write data buffer (WDB) 746.

Interface 712 has a first bidirectional connection to data fabric 450 over an external bus, and has an output. In memory controller 700, this external bus is compatible with the advanced extensible interface version four specified by ARM Holdings, PLC of Cambridge, England, known as "AXI4", but can be other types of interfaces in other embodiments. Interface 712 translates memory access requests from a first clock domain known as the FCLK (or MEMCLK) domain to a second clock domain internal to memory controller 700 known as the UCLK domain. Similarly, queue 714 provides memory accesses from the UCLK domain to the DFICLK domain associated with the DFI interface.

Address generator 722 decodes addresses of memory access requests received from data fabric 450 over the AXI4 bus. The memory access requests include access addresses in the physical address space represented in a normalized format. Address generator 722 converts the normalized addresses into a format that can be used to address the actual memory devices in memory system 320, as well as to efficiently schedule related accesses. This format includes a region identifier that associates the memory access request with a particular rank, a row address, a column address, a bank address, and a bank group. On startup, the system BIOS queries the memory devices in memory system 320 to determine their size and configuration, and programs a set of configuration registers associated with address generator 722. Address generator 722 uses the configuration stored in the configuration registers to translate the normalized addresses into the appropriate format. Command queue 720 is a queue of memory access requests received from the memory accessing agents in data processing system 300, such as CPU cores 412 and 414 and graphics core 420.

Command queue 720 stores the address fields decoded by address generator 722 as well other address information that allows arbiter 738 to select memory accesses efficiently, including access type and quality of service (QoS) identifiers. CAM 724 includes information to enforce ordering rules, such as write after write (WAW) and read after write (RAW) ordering rules.

Replay queue 730 is a temporary queue for storing memory accesses picked by arbiter 738 that are awaiting responses, such as address and command parity responses, write cyclic redundancy check (CRC) responses for DDR4 DRAM or write and read CRC responses for gDDR5 DRAM. Replay queue 730 accesses ECC check block 742 to determine whether the returned ECC is correct or indicates an error. Replay queue 730 allows the accesses to be replayed in the case of a parity or CRC error of one of these cycles.

Refresh logic 732 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic 732 generates refresh commands periodically to prevent data errors caused by leaking of charge off storage capacitors of memory cells in DRAM chips. In addition, refresh logic 732 periodically calibrates ZQ to prevent mismatch in on-die termination resistance due to thermal changes in the system.

Arbiter 738 is bidirectionally connected to command queue 720 and is the heart of memory channel controller 710. It improves efficiency by intelligent scheduling of accesses to improve the usage of the memory bus. Arbiter 738 uses timing block 734 to enforce proper timing relationships by determining whether certain accesses in command queue 720 are eligible for issuance based on DRAM timing parameters. For example, each DRAM has a minimum specified time between activate commands, known as "tRC". Timing block 734 maintains a set of counters that determine eligibility based on this and other timing parameters specified in the JEDEC specification, and is bidirectionally connected to replay queue 730. Page table 736 maintains state information about active pages in each bank and rank of the memory channel for arbiter 738, and is bidirectionally connected to replay queue 730.

In response to write memory access requests received from interface 712, ECC generation block 744 computes an ECC according to the write data. DB 746 stores the write data and ECC for received memory access requests. It outputs the combined write data/ECC to queue 714 when arbiter 738 picks the corresponding write access for dispatch to the memory channel.

Power controller 750 generally includes an interface 752 to an advanced extensible interface, version one (AXI), an APB interface 754, and a power engine 760. Interface 752 has a first bidirectional connection to the SMN, which includes an input for receiving an event signal labeled "EVENT_n" shown separately in FIG. 7, and an output. APB interface 754 has an input connected to the output of interface 752, and an output for connection to a PHY over an APB. Power engine 760 has an input connected to the output of interface 752, and an output connected to an input of queue 714. Power engine 760 includes a set of configuration registers 762, a microcontroller (μC) 764, a self-refresh controller (SLFREF/PE) 766, and a reliable read/write timing engine (RRW/TE) 768. Configuration registers 762 are programmed over the AXI bus, and store configuration information to control the operation of various blocks in memory controller 700. Accordingly, configuration registers 762 have outputs connected to these blocks that are not shown in detail in FIG. 7. Self-refresh controller 766 is an engine that allows the manual generation of refreshes, in addition, to the automatic generation of refreshes by refresh logic 732. Reliable read/write timing engine 768 provides a continuous memory access stream to memory or I/O devices for such purposes as DDR interface maximum read latency (MRL) training and loopback testing.

Memory channel controller 710 includes circuitry that allows it to pick memory accesses for dispatch to the associated memory channel. In order to make the desired arbitration decisions, address generator 722 decodes the address information into predecoded information including rank, row address, column address, bank address, and bank group in the memory system, and command queue 720 stores the predecoded information. Configuration registers 762 store configuration information to determine how address generator 722 decodes the received address information. Arbiter 738 uses the decoded address information, timing eligibility information indicated by timing block 734, and active page information indicated by page table 736 to efficiently schedule memory accesses while observing other criteria such as QoS requirements. For example, arbiter 738 implements a preference for accesses to open pages to avoid the overhead of precharge and activation commands required to change memory pages, and hides overhead accesses to one bank by interleaving them with read and write accesses to another bank. In particular during normal operation, arbiter 738 normally keeps pages open in different banks until they are required to be precharged prior to selecting a different page.

Figure 8:
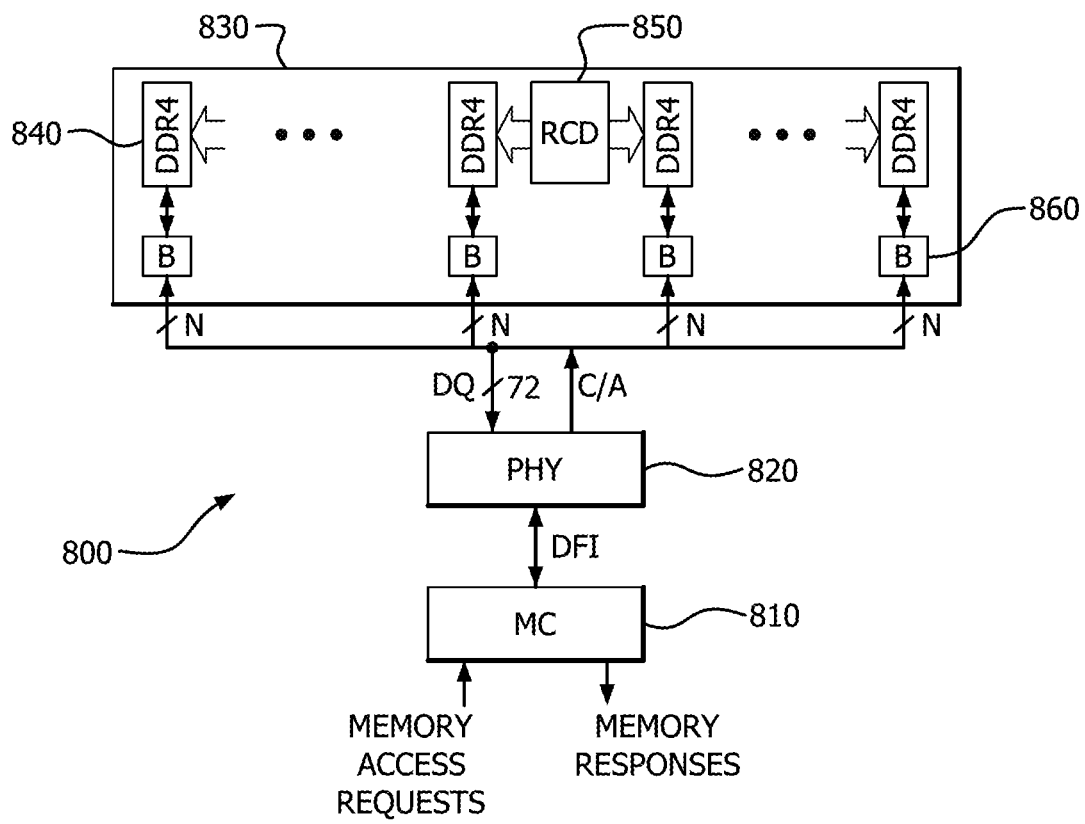
FIG. 8 illustrates in block diagram form a data processing system corresponding to portions of the data processing system of FIG. 3 according to some embodiments.

FIG. 8 illustrates in block diagram form a data processing system 800 corresponding to portions of data processing system 300 of FIG. 3 according to some embodiments. Data processing system 800 includes generally a memory controller labeled "MC" 810, a PHY 820, and a memory module 830.

Memory controller 810 receives memory access requests from and provides memory responses to a memory accessing agent of the processor, such as CPU core 412 or graphics core 420. Memory controller 810 corresponds to either one of memory controllers 490 of FIG. 4. Memory controller 810 outputs memory accesses to and receives responses from PHY 820 over a DFI-compatible bus.

PHY 820 is connected to memory controller 810 over the DFI bus. It performs the physical signaling in response to received memory accesses by providing a set of command and address outputs labeled "C/A" and a set of 72 bidirectional data signals labeled "DQ", including 64 bits of data and 8 bits of ECC.

Memory module 830 can support any of a number of memory types and speed grades. In the illustrated embodiment, memory module 830 is a DDR4 registered DIMM (RDIMM) that includes a set of memory chips 840 each labeled "DDR4", a register clock driver 850 labeled "RCD", and a set of buffers 860 each labeled "B". Memory chips 840 include an M-bit set of by N memory chips. To support 72 data signals (64 bits of data plus 8 bits of ECC), M*N=72. For example if each memory chip is by four (N=4), then memory module 830 includes 18 DDR4 memory chips. Alternatively if each memory chip is by eight (N=8), then memory module 830 includes 9 DDR4 memory chips. Each of buffers 860 is associated with one by N memory chip and is used to latch the corresponding N bits of data. In the example shown in FIG. 8, memory module 830 contains DDR4 memory, and the C/A signals include those signals described in the DDR4 Specification. The DDR4 Specification specifies a "fly-by" architecture in which the same C/A signals that are received and latched by RCD 850 are re-driven left and right to each of memory chips 840. However data signals DQ are provided only to corresponding buffers and memories.

Memory module 830 operates according to control information for RCD 850 programmed into the register control word (RCW) and for buffers 860 programmed into the buffer control word (BCW). Thus when memory controller 810 places memory module 830 into a low power state, it also changes the settings in the RCW and BCW, in a manner that will be described more fully below.

While data processing system 800 uses a registered, buffered DDR4 DRAM DIMM as memory module 830, memory controller 810 and PHY 820 are also able to interface to several different types of memory modules. In particular, memory controller 810 and PHY 820 are able to support several different types of memory (e.g., DDR, FLASH, PCM, etc.), several different register conditions (none used, RCD, flash controller, etc.) and several different buffer conditions (none used, data buffer only, etc.) such that memory controller 810 supports a wide variety of combinations of memory type, register condition, and buffer condition. To support these combinations, memory controller 810 implements an architecture that allows unique plans for entering and exiting low power modes that system BIOS can program for the specific memory system characteristics. These features will now be described.

Figure 9:
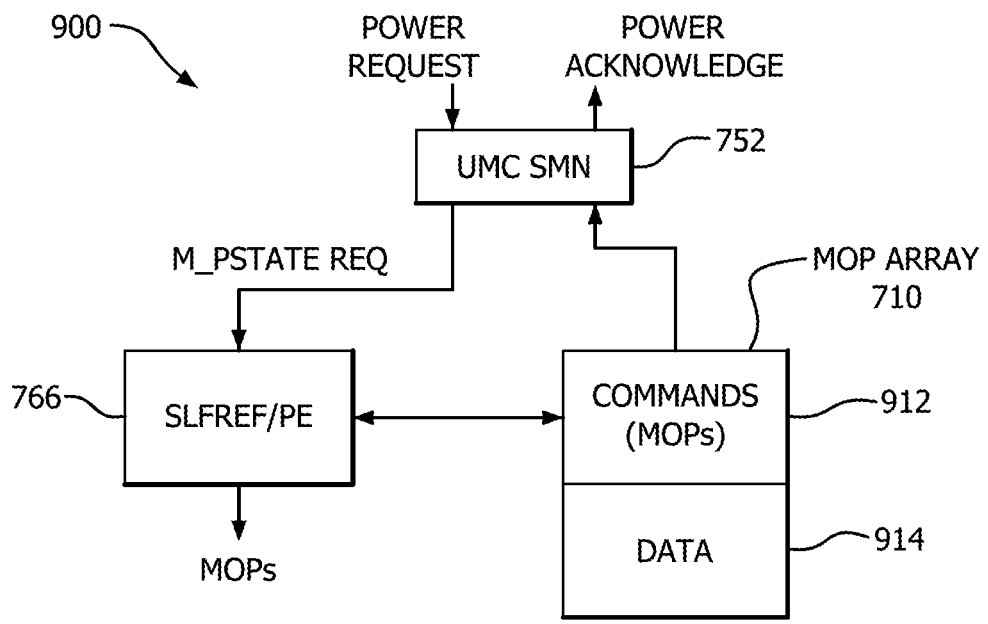
FIG. 9 illustrates in block diagram form a memory channel controller corresponding to portions of the memory channel controller of FIG. 7 according to some embodiments.

FIG. 9 illustrates in block diagram form a memory channel controller 900 corresponding to portions of memory channel controller 750 of FIG. 7 according to some embodiments. Memory channel controller 900 includes UMCSMN 752 and self-refresh controller 766 as illustrated in FIG. 7 above, and a memory operation (MOP) array 710. UMCSMN 752 has a first port for connection to the SMN as described above, and as shown in pertinent detail here has an input for receiving a power state change request signal labeled "POWER REQUEST" from data fabric 450, and an output for providing a power state change acknowledge signal labeled "POWER ACKNOWLEDGE" to data fabric 450. UMCSMN 752 also has a second port with a first output for providing a memory power state change request signal labeled "M_PSTATE REQ" and a second output for providing data for storage in MOP array 910. Self-refresh controller 766 has an input connected to the first output of the second port of UMCSMN 752, a bidirectional port, and an output connected to BEQ 714 for providing decoded MOPs to BEQ 714. MOP array 910 has an input connected to the second output of the second port of UMCSMN 752, and a bidirectional connection to self-refresh controller 766 and is divided into a first portion 912 for storing commands (i.e., MOPs), and a second portion 914 for storing data.

In an example, on startup, the system BIOS stored in system BIOS memory 357 queries memory system 320 to determine the type of memory that has been installed and its capabilities. It typically does so by reading registers in the serial presence detect (SPD) memory on each DIMM present in the system. For example, the PHY may support any one of DDR3, DDR4, low power DDR4 (LPDDR4), and graphics DDR version five (gDDR5) memory. In response to detecting the type and capabilities of memory installed in memory system 320, the system BIOS populates MOP array 910 with a sequence of commands that initiate entry into and exit from supported low power modes for the particular type of memory.

In the illustrated embodiment, memory channel controller 750 supports various device low power states defined according to the model described by the Advanced Configuration and Power Interface (ACPI) Specification. According to the ACPI Specification, the working state of a device (such as memory controller 700) is known as the D0 state or the "fully on" state. The other states are low power states and include the D1, D2, and D3 states, in which the D3 state is the "off" state. Memory controller 700 is capable of placing memory system 320 into low power states corresponding to the D state of memory controller 700 as well as making frequency and/or voltage changes in the D0 state. Upon receipt of a POWER REQUEST, UMCSMN 752 provides the M_PSTATE REQ signal to self-refresh controller 766 to indicate which power state is requested. Self-refresh controller 766 accesses MOP array 910 in response to execute a sequence of MOPs that place the memory chips and the RCW and BCW of the DIMM (if supported) in the appropriate states for the requested D state. Self-refresh controller 766 outputs indexes into MOP array 910, and MOP array 910 returns encoded commands (MOPs) in response.

By including MOP array 910 to store programmable commands from firmware for self-refresh controller 766, memory channel controller 750 is implemented using a relatively small amount of circuit area while supporting a wide variety of memory types with different characteristics. Moreover it provides an upward compatible architecture that allows memory state changes for memory types and characteristics that are not yet specified but may be specified in the future. Thus memory channel controller 750 is also modular and avoids the need for a costly future redesign.

The interaction between these memory controller device power states (D-states) and the DRAM operation will now be described. The D0 state is the operational state for memory controller 700. In the D0 state, memory controller 700 supports four programmable power states (P-states) each having a different MEMCLK frequency and associated timing parameters. Memory controller 700 maintains a set of registers for each P-state storing timing parameters for that P-state and defining a context. Memory controller 700 places the DRAMs into the self-refresh mode to change P-states/contexts. MOP array 910 includes a set of commands for use with a frequency change in the D0 state to support the proper sequencing.

The D1 state is known as the stopclock state and is used for memory state change requests. When memory controller 700 is placed in the D1 state, entry and exit latency are the lowest, except when it is necessary to retrain PHY 820. Memory controller 700 typically does not flush any arbitration queue entries as a result of a D1 power state change request. However, memory controller 700 flushes all writes in command queue 720 beforehand, while normal pending refreshes are typically not executed. Memory controller 700 places all memory chips in the system into either precharge power down or self-refresh.

The D2 state is known as the standby state and corresponds to system C1/C2/C3 and stop-clock/stutter states. It is a lower power state for the operation of memory controller 700. In the D2 state, memory controller 700 uses local clock gating and optional power gating to further reduce power. Memory controller 700 flushes both writes and reads from command queue 720. In the D2 state memory controller 700 likewise places all memory in the system into precharge power down with auto self-refresh enabled. However since D2 is a deeper power state, it performs all soon to be required ("owed") refreshes prior to entry into precharge power down with auto self-refresh.

The D3 state is known as the suspend state. Memory controller 700 supports two D3 states. The first D3 state is used for system S3 state. Memory controller 700 places DRAMs and PHYs into the lowest power state in anticipation of entering system S3 state. Memory controller 700 typically flushes writes from command queue 720, and executes pending refresh cycles. The second D3 state is used for asynchronous DRAM refresh (ADR-style self-refresh). ADR is a feature used in servers to flush pending write data into a non-volatile memory during a power failure or system crash. DRAMs and PHYs are again placed into precharge power down with auto self-refresh enabled.

As used here, the POWER REQUEST signal indicates a change from any one power state to a different power state. The available power states differ between different memory types. Moreover as used herein, a "low power state" means a state that saves power compared to another state. For example, DDR4 SDRAM supports two low power states known as self-refresh and precharge power down. LPDDR4, however, supports three low power states known as active power down, self-refresh power down, and idle power down. The conditions in which these states can be entered and exited are different and are specified in the state diagrams of the corresponding published JEDEC standards, and "low power state" encompasses any of these states.

MOP array 910 supports a command format that allows the efficient encoding of commands to support all of these power state changes. MOP array 910 uses two arrays known as "SrEnterMOP" and "SrExitMOP" for each of the four P-state contexts. SrEnterMOP is processed before entering self-refresh for a P-state request. SrExitMOP is processed after exiting self-refresh for a P-state request. The MOP array specifies a sequential list of mode register (MR), MR with per-DRAM accessibility (PDA), register control word (RCW), or buffer control word (BCW) commands. Upon receipt of a power state change request, self-refresh controller 766 accesses the commands for the selected context in MOP array 910 to determine the sequence and timing of MOPs that are issued to the memory system.

The MOPs in portion 912 include fields that signify the corresponding D-state or states in portion 912. Thus, self-refresh controller 766 scans MOP array 912 starting from the first location for commands that are applicable to the particular context, and ignores MOPs that are not applicable to the current context. MOP array 912 also includes counter values to determine, when appropriate, proper timing between MOPs to satisfy dynamic timing parameters of the memory chips. After beginning a command sequence, self-refresh controller 766 continues scanning MOP array 912 and executing valid commands until it encounters a null entry, which indicates the end of the sequence for the power state change.

Figure 10:
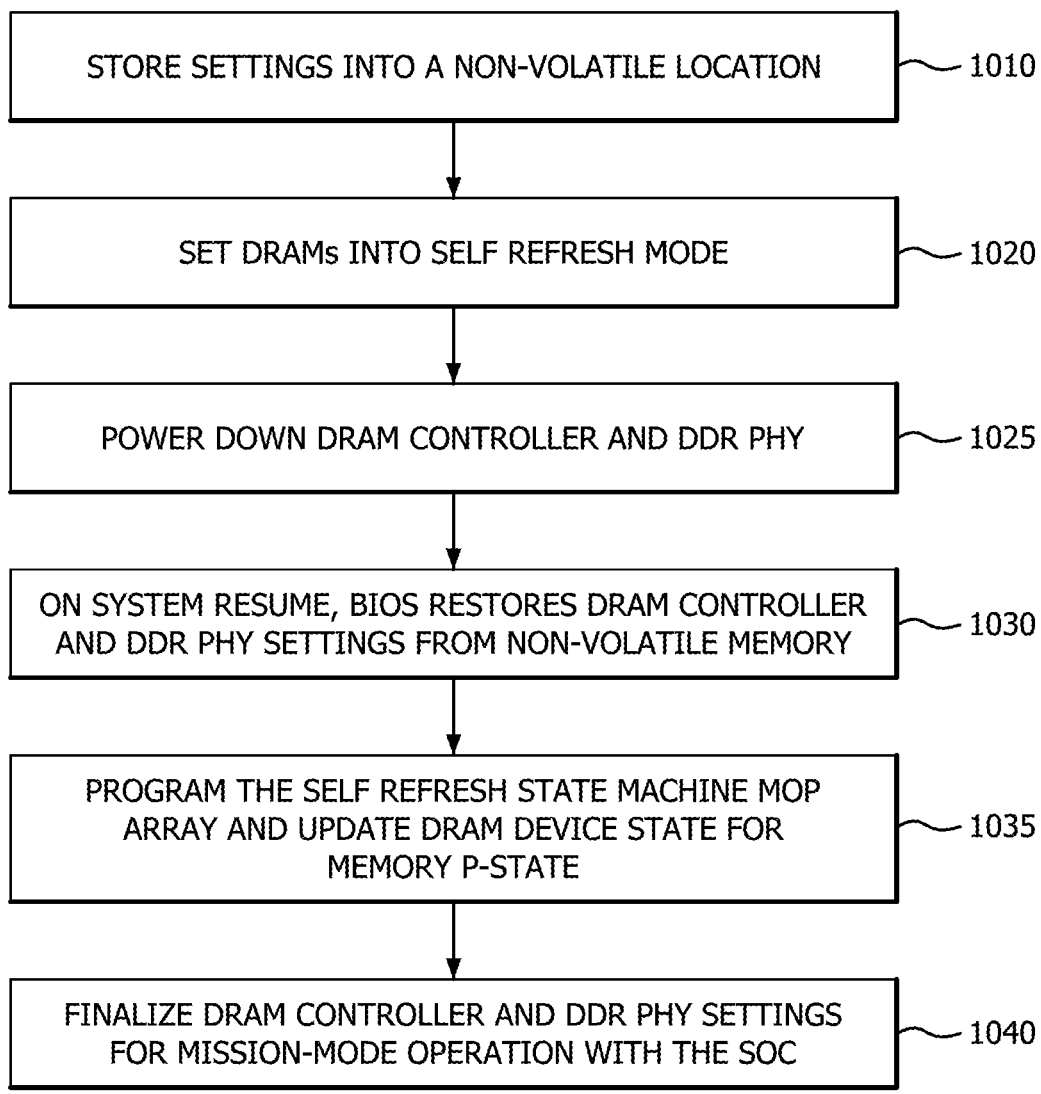
FIG. 10 illustrates a method for the reduced boot time of system-on-a-chip (SOC) by reducing double data rate (DDR) training.

FIG. 10 illustrates a method 1000 for the reduced boot time of an SOC in the memory context restore-reduce boot time of the SOC by reducing DDR training. Method 1000 includes, at step 1010, prior to restore, the DRAM controller and DDR PHY settings, including any values for that processor/platform/DRAM combination that are stored into a non-volatile location.

At step 1020, in DDR4 mode, for S3 the DRAMs are then set by the DRAM controller into self-refresh mode. The DRAM controller and DDR PHY are then powered down to save total system power at step 1025.

At step 1030, on system resume, the BIOS restores the DRAM controller and the DDR PHY settings from the non-volatile memory. For S3, the self-refresh state machine MOP array (small code for optimized state machine) is programmed to exit self-refresh and to update any DRAM device state for the target power management state (memory P-state) at step 1035.

At step 1040, the DRAM controller and the DDR PHY settings are finalized for mission-mode operation with the SOC.

Figure 11:
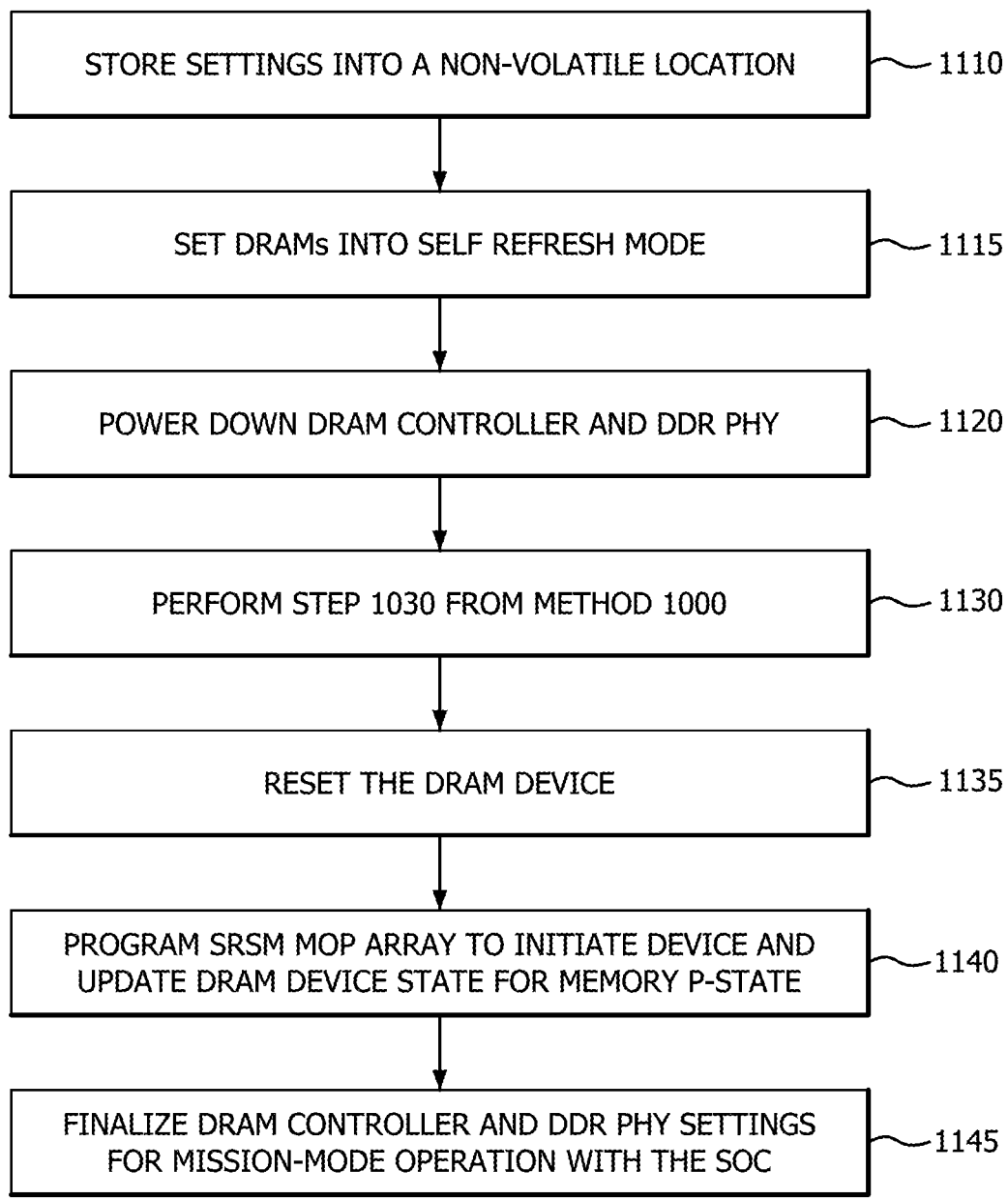
FIG. 11 illustrates a method for the memory context restore by reducing DDR training.

FIG. 11 illustrates a method 1100 for the memory context restore in the memory context restore-reduce boot time of an SOC by reducing DDR training. Method 1100 includes, at step 1110, prior to restore, the DRAM controller and the DDR PHY settings, including any values for that processor/platform/DRAM combination, are stored in a non-volatile memory location.

At step 1115, in DDR4 mode, the DRAMs are then set into self-refresh mode by the DRAM controller. The DRAM controller and DDR PHY are then powered down to save total system power or the entire system may have power removed at step 1120.

At step 1130, step 1030 from method 1000 is followed, including on system resume, the BIOS restores the DRAM controller and the DDR PHY settings from the non-volatile memory, and/or the DRAM device is optionally reset at step 1135. This reset includes programing the self-refresh state machine MOP array to re-initialize the DRAM device (per the JEDEC specification sequence) for the target power management state (memory P-state) at step 1140. At step 1145, the DRAM controller and the DDR PHY settings are finalized for mission-mode operation with the SOC.

While method 1000 and method 1100 are described using separate figures, each part of method 1000 and method 1100 may be used interchangeably or in addition to the steps described for method 1000 and method 1100. In method 1000 and method 1100, software mode register access mechanisms may be used to finalize DRAM settings. While the present description uses DRAM for clarity of the discussion, the described methods also apply to other associated components on an RDIMM or LRDIMM modules such as RCD or DB.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the accelerated processing device 116, the scheduler 136, the graphics processing pipeline 134, the compute units 132, the SIMD units 138, and the APU 310) may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for reducing boot time of a system-on-a-chip (SOC) by reducing double data rate (DDR) memory training, the method comprising:
storing dynamic random-access memory (DRAM) controller and DDR physical interface (PHY) settings into a non-volatile memory;
setting DRAMs into a self-refresh mode;
powering down a DRAM controller and a DDR PHY;
on system resume for boot training, restoring DRAM controller and DDR PHY settings from the non-volatile memory using a system basic input/out system (BIOS);
programing a self-refresh state machine memory operation (MOP) array to enable the DRAMs to exit self-refresh mode and update any DRAM device state for a target power management state; and
configuring DRAM controller and DDR PHY settings for operation with the SOC.

2. The method of claim 1, wherein the setting the DRAMs into self-refresh mode comprises preserving the memory contents.

3. The method of claim 2, wherein preserving the memory contents includes the DRAMs entering a low power mode.

4. The method of claim 1, wherein the powering down the DRAM controller and the DDR PHY provides a fast boot from system states.

5. The method of claim 1, wherein the powering down the DRAM controller and the DDR PHY provides a warm reset.

6. The method of claim 1, wherein the powering down the DRAM controller and the DDR PHY provides a reset of the DRAM controller and the DDR PHY.

7. The method of claim 1, wherein the configuring DRAM controller and DDR PHY settings for operation with the SOC comprises configuring any controller settings and PHY settings by programming a configuration.

8. The method of claim 7, wherein configuring settings includes updating the MOP array and timings for optimal P-state switching.

9. The method of claim 7, wherein configuring settings includes an initialization sequence.

10. A method for restoring a memory context of a system-on-a-chip (SOC) by reducing double data rate (DDR) memory training, the method comprising:
storing DRAM controller and DDR physical interface (PHY) settings into a non-volatile memory;
powering down a DRAM controller and a DDR PHY;
on system resume to restore the memory context after power down, restoring DRAM controller and DDR PHY settings from the non-volatile memory using a system basic input/output system (BIOS);
resetting DRAMs device;
programming a self-refresh state machine memory operation (MOP) array to reinitialize a DRAM device state for a target power management state; and
configuring DRAM controller and DDR PHY settings for operation with the SOC.

11. The method of claim 10, wherein powering down the DRAM controller fails to preserve a memory state.

12. The method of claim 10, wherein the powering down the DRAM controller and the DDR PHY provides a fast boot from system states.

13. The method of claim 10, wherein the powering down the DRAM controller and the DDR PHY provides at least one of a warm reset, a cold reset, and a complete new power cycle from mechanical off.

14. The method of claim 10, wherein the powering down the DRAM controller and the DDR PHY provides a reset of the DRAM controller and the DDR PHY.

15. The method of claim 10, wherein the configuring DRAM controller and DDR PHY settings for operation with the SOC comprises configuring any controller settings and PHY settings by programming a configuration.

16. The method of claim 15, wherein configuring settings includes updating the MOP array and timings for optimal P-state switching.

17. The method of claim 15, wherein configuring settings includes an initialization sequence.

18. A system for reducing boot time of a system-on-a-chip (SOC) by reducing double data rate (DDR) memory training, the system comprising:
a dynamic random-access memory (DRAM) controller and a DDR physical interface (PHY) with settings stored into a non-volatile memory;
a plurality of DRAMs set into self-refresh mode, wherein the DRAM controller and the DDR PHY are powered down;
on system resume for boot training, a system basic input/output system (BIOS) restoring DRAM controller and DDR PHY settings from the non-volatile memory; and
a self-refresh state machine memory operation (MOP) array programmed to enable the plurality of DRAMs to exit self-refresh mode and update any DRAM device state for a target power management state,
wherein the DRAM controller and the DDR PHY settings are configured for operation with the SOC.

19. The system of claim 18, wherein the setting DRAMs into self-refresh mode comprises preserving the memory contents.

20. The system of claim 19, wherein preserving memory contents includes the DRAMs entering a low power mode.

* * * * *